(12) United States Patent
Katou

(10) Patent No.: US 8,008,718 B2
(45) Date of Patent: Aug. 30, 2011

(54) SEMICONDUCTOR DEVICE AND PRODUCTION METHOD THEREOF

(75) Inventor: Sumio Katou, Yamatokoriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 466 days.

(21) Appl. No.: 11/792,048

(22) PCT Filed: Oct. 17, 2005

(86) PCT No.: PCT/JP2005/019060
§ 371 (c)(1),
(2), (4) Date: Jun. 1, 2007

(87) PCT Pub. No.: WO2006/064606
PCT Pub. Date: Jun. 22, 2006

(65) Prior Publication Data
US 2007/0295976 A1      Dec. 27, 2007

(30) Foreign Application Priority Data
Dec. 14, 2004   (JP) ................................ 2004-361981

(51) Int. Cl.
*H01L 27/088* (2006.01)
(52) U.S. Cl. ................................. 257/336; 257/E29.266
(58) Field of Classification Search .......... 438/149–154; 257/336, 344, 408, E29.266, E21.435, E21.437
See application file for complete search history.

(56) References Cited

U.S. PATENT DOCUMENTS

| | | | | |
|---|---|---|---|---|
| 5,264,383 A | * | 11/1993 | Young ............................. | 438/151 |
| 5,563,427 A | * | 10/1996 | Yudasaka et al. ................ | 257/72 |
| 5,879,976 A | | 3/1999 | Fujiwara | |
| 5,923,961 A | | 7/1999 | Shibuya et al. | |
| 5,953,582 A | * | 9/1999 | Yudasaka et al. ................ | 438/29 |
| 6,121,660 A | * | 9/2000 | Yamazaki et al. .............. | 257/348 |
| 6,160,269 A | * | 12/2000 | Takemura et al. .............. | 257/59 |
| 6,172,671 B1 | | 1/2001 | Shibuya et al. | |
| 6,509,212 B1 | * | 1/2003 | Zhang et al. ................... | 438/149 |
| 2003/0104659 A1 | * | 6/2003 | Arakawa et al. ............... | 438/154 |
| 2005/0164434 A1 | | 7/2005 | Arakawa et al. | |

FOREIGN PATENT DOCUMENTS

JP          4-323875          11/1992

(Continued)

OTHER PUBLICATIONS

International Search Report for PCT/JP2005/019060 mailed Feb. 21, 2006 (English and Japanese).

*Primary Examiner* — Zandra Smith
*Assistant Examiner* — Ali Naraghi
(74) *Attorney, Agent, or Firm* — Nixon & Vanderhye P.C.

(57) ABSTRACT

The semiconductor device of the present invention is a semiconductor device including P-type and N-type thin film transistors, at least one of the N-type thin film transistors having an off-set gate structure, at least one of the P-type thin film transistors having a LDD structure, wherein a P-type high concentration impurity layer for forming the at least one P-type thin film transistor is formed on the semiconductor layer in a region other than a region below a gate electrode and a sidewall spacer and contains a higher concentration of a P-type impurity together with an impurity contained in an N-type low concentration impurity layer and an N-type high concentration impurity layer for forming the N type thin film transistor.

8 Claims, 5 Drawing Sheets

FOREIGN PATENT DOCUMENTS

| | | | |
|---|---|---|---|
| JP | 6-13404 | | 1/1994 |
| JP | 6013404 | * | 1/1994 |
| JP | 6-140424 | | 5/1994 |
| JP | 9-172183 | | 6/1997 |
| JP | 10-65176 | | 3/1998 |
| JP | 10-144929 | | 5/1998 |
| JP | 2000-183355 | | 6/2000 |
| JP | 2003-229433 | | 8/2003 |

* cited by examiner

US 8,008,718 B2

SEMICONDUCTOR DEVICE AND PRODUCTION METHOD THEREOF

This application is the US national phase of international application PCT/JP2005/019060 filed 17 Oct. 2005, which designated the U.S. and claims benefit of JP 2004-361981 filed 14 Dec. 2004, the entire contents of each of which are hereby incorporated by reference.

TECHNICAL FIELD

The present invention relates to semiconductor devices, production methods thereof, thin film transistor array substrates, and liquid crystal display devices. More specifically, the present invention relates to a semiconductor device, a production method thereof, a thin film transistor array substrate, and a liquid crystal display device, which can be preferably used in a monolithic liquid crystal display (system liquid crystal).

BACKGROUND ART

A Thin Film Transistor (hereinafter, also referred to as "TFT") has been used in a switching element formed in a pixel or a driver circuit in an active matrix liquid crystal display device (hereinafter, also referred to as "liquid crystal display"), a Contact Image Sensor (CIS), or a Large Scale Integration (LSI) having SRAM (Static Random Access Memories) However, as growth in size and improvement in resolution have been accompanied in the liquid crystal display, reduction in production costs has become a problem, and reduction in production steps of the TFT also has become a problem, recently.

A technology of producing a liquid crystal display including a monolithic (integrated) circuit in which driving and control circuits for liquid crystal are monolithically formed (integrated), so-called monolithic liquid crystal display (system liquid crystal) has been drawn attention as a measure for solving such a problem. Such a monolithic liquid crystal display can significantly reduce the number of components as well as liquid crystal display assembling production steps and liquid crystal display examination steps. Therefore, use of such a display permits reduction in production costs and improvement in reliability.

In such a monolithic liquid crystal display, polysilicon, and CG silicon (continuous grain boundary crystal silicon) are preferably used as a semiconductor material for forming the TFT. Such semiconductor materials are preferable for forming the monolithic driving circuit and the like, because such materials are excellent in field-effect mobility and can be formed as a film through a low temperature (500° C. or less) process. However, if such a TFT formed of polysilicon and the like has a structure, so-called self-align structure, in which source and drain terminals and a gate terminal overlap with each other, an off-state current is larger than that in a TFT formed of amorphous silicon. Therefore, such a TFT with a self-align structure is not suitably used as a pixel switching element.

Under the above circumstances, TFTs having a structure, so-called offset gate structure, in which the source and drain terminals are positioned in such a way that a distance between each of the source and drain terminals and the gate terminal is several micrometers (this distance is referred to as offset length), have been widely known conventionally (for example, refer to Patent Documents 1 and 2). Such TFTs having an offset gate structure can effectively reduce the off-state current, and therefore can be preferably used as a pixel switching element. As for TFTs forming the driving circuit and the like, a sufficient large on-state current is needed. Therefore, recently, TFTs having a channel length of 2 µm or less is being developed. However, such TFTs having an offset gate structure has little margin for structure. For example, an on-state current is significantly reduced or an effect for reducing the off-state current is significantly deteriorated if the offset length is out of the optimal value. Therefore, such TFTs are not suitable as a TFT having a short channel length which suitably constitutes a driving circuit and the like.

Therefore, for the TFT having a short channel length, a structure, so-called self-align LDD (Lightly Doped Drain structure, in which a low concentration impurity is added (ion-doped) into an offset region in a semiconductor layer, is generally adopted (for example, refer to Patent Document 3). If such a self-align LDD structure is adopted, high reliability can be maintained and simultaneously hot carrier-induced degradation can be reduced even if the channel length is shortened. In addition, the production steps of the TFT can be simplified if the self-align LDD structure is adopted. Therefore, such a self-align LDD structure is particularly important if a TFT having a channel length of 2 µm or less is formed on a large substrate.

A method of forming a semiconductor device including a TFT having a conventional self-align LDD structure is mentioned below with reference to FIGS. 5 (a) to (g).

An insulating film 2, a semiconductor layer 3, a gate insulating film 4, and a gate electrode 6 are first formed on a substrate 1, and then a phosphorus ion 7 is injected into a part of the semiconductor layer 3 for forming an N-type TFT, and a boron ion 12 is injected into a part of the semiconductor layer 3 for forming a P-type TFT. As a result, an N-type low concentration impurity region 8 and a P-type low concentration impurity region 13 are formed (FIGS. 5 (a) and (b)). Then, a first interlayer insulating film 15 is formed (FIG. 5 (c)), and then the first interlayer insulating film 15 and the gate insulating film 4 are anisotropically etched to form a sidewall spacer 16 on side surfaces of the gate electrode and simultaneously the gate insulating film 4 is patterned (FIG. 5 (d)). Then, a phosphorus ion 28 is injected into the N-type low concentration impurity region 8, and a boron ion 19 is injected into the P-type low concentration impurity region 13 using the gate electrode 6 and the sidewall spacer 16 as a mask. As a result, an N-type high concentration impurity region 24 and a P-type high concentration impurity region 26 are formed in a self-align manner, and simultaneously an N-type LDD region 25 and a P-type LDD region 27 are formed in the semiconductor layer 3 below the sidewall spacer 16 in a self-align manner (FIGS. 5 (e) and (f)). Then, a heat treatment is performed to activate the impurity ions 7, 12, 28, and 19 injected into the N-type LDD region 25, the P-type LDD region 27, the N-type high concentration impurity region 24, and the P-type high concentration impurity region 26, respectively, and to repair the crystallinity of the entire semiconductor layer 3. Then, a second interlayer insulating film 21, a contact hole, source and drain wirings 22 are successively formed, and finally a third insulating film 23 is formed (FIG. 5 (g)).

Such a semiconductor device including N-type and P-type TFTs having a conventional self-align LDD structure can provide high reliability and reduce the hot carrier-induced degradation, but such a semiconductor device still has room for improvement in further reduction in the off-state current and simplification of the production steps. In addition, such a semiconductor device has a structure in which the channel region and the high concentration impurity region that is a source or drain region are formed in the same semiconductor layer, and therefore improvement in field-effect mobility in the channel region and reduction in resistance in the source or drain region can not be simultaneously attained, and therefore, such a structure is not suitable for improvement in TFT performances. In such a respect, such a semiconductor has room for improvement.

For this problem, a semiconductor device including: a first conductive type TFT with a LDD (self-align LDD) structure in which a first conductive type low concentration source or drain region is included between a first conductive type high concentration source or drain region and a first channel region; and a second conductive type TFT with an offset structure in which an offset region is included between a second conductive type high concentration source or drain region and a second channel region, is disclosed (for example, refer to Patent Document 4). This semiconductor device can provide high reliability and effectively reduce the off-state current and the hot carrier-induced degradation. However, such a semiconductor device still has room for simplification of the production steps and improvement in the TFT performances.

[Patent Document 1]
Japanese Kokai Publication No. Hei-06-13404 (pages 2 and 7, FIG. 1)
[Patent Document 2]
Japanese Kokai Publication No. Hei-06-140424 (pages 2 and 6, FIG. 1)
[Patent Document 3]
Japanese Kokai Publication No. Hei-04-323875 (pages 2, 4, and 7, FIG. 3)
[Patent Document 4]
Japanese Kokai Publication No. Hei-09-172183 (pages 16 and 50, FIG. 1)

DISCLOSURE OF INVENTION

The present invention has been made in view of the above-mentioned state of the art. The present invention has an object to provide a semiconductor device, a production method thereof, a thin film transistor array substrate, and a liquid crystal display device, which can reduce an off-state current and hot carrier-induced degradation, improve performances of thin film transistors, and simplify production steps.

The present inventors made various investigations about methods for reducing the off-state current and the hot carrier-induced degradation in semiconductor devices including P-type and N-type thin film transistors (TFTs), and noted a configuration of each conductive type TFT. The inventors found that if at least one N-type TFT has a structure, so-called off-set gate structure, in which a semiconductor layer, a gate insulating film, and a gate electrode are formed on a substrate in this order, and a sidewall spacer formed on a side surface of the gate electrode, and low concentration and high concentration impurity layers formed on the semiconductor layer in a region other than a region below the gate electrode and the sidewall spacer, are included, and at least one P-type TFT has a structure, so-called LDD structure, in which a semiconductor layer including a P-type low concentration impurity region formed in a region other than a region below a gate electrode, a gate insulating film, and the gate electrode are formed on the substrate in this order, and a sidewall spacer formed on a side surface of the gate electrode and a P-type high concentration impurity layer formed on the P-type low concentration impurity region are included, reduction in off-state current, which is a feature of TFTs having an offset gate structure, and reduction in hot carrier-induced degradation, which is a feature of TFTs having a LDD structure, can be simultaneously attained on the same substrate in a semiconductor device including these TFTs. The inventors also found that the performances of TFTs can be improved by increasing the thickness of the high concentration impurity layer, thereby lowering the resistance, or by decreasing the thickness of the semiconductor layer, thereby improving the field-effect mobility in the channel region, because the semiconductor layer including the channel region and the high concentration impurity layer serving as a source or drain region are separately formed as an independent layer in the P-type and N-type TFTs having such structures.

Further, the present inventors made various investigations about production steps of such a semiconductor device, and noted the configuration of the P-type high concentration impurity layer and the formation steps thereof. The inventors found that the production steps of the semiconductor device can be simplified if the P-type high concentration impurity layer is formed on the semiconductor layer in a region other than a region below the gate electrode and the sidewall spacer and the P-type high concentration impurity layer contains a higher concentration of the P-type impurity in addition to the N-type impurity contained in the N-type low concentration impurity layer and the N-type high concentration impurity layer. That is, the inventors found that at least the step of injecting the N-type impurity can be eliminated among the steps of forming the P-type and N-type high concentration impurity layers, for example, by successively forming an N-type low concentration impurity layer and an N-type high concentration impurity layer on a semiconductor layer for forming P-type and N-type TFTs, and then injecting an P-type impurity into the N-type low concentration impurity layer and the N-type high concentration impurity layer for forming the P-type TFT, thereby forming a P-type high concentration impurity layer. Further, the inventors found that a semiconductor device having an opposite relationship between the conductive type and the structure, that is, a semiconductor device including an N-type TFT with a LDD structure and a P-type TFT with an offset gate structure also can exhibit the same functional effects. The above-mentioned problems can be admirably solved, leading to completion of the present invention.

That is, the present invention is a semiconductor device comprising P-type thin film transistors and N-type thin film transistors, each of the P-type thin film transistors and the N-type thin film transistors comprising low concentration and high concentration impurity layers or impurity regions having different impurity concentrations, wherein at least one of the N-type thin film transistors comprises a semiconductor layer, a gate insulating film, and a gate electrode on a substrate in this order, and further comprises a sidewall spacer formed on a side surface of the gate electrode, and an N-type low concentration impurity layer and an N-type high concentration impurity layer stacked on the semiconductor layer in a region other than a region below the gate electrode and the sidewall spacer, and wherein at least one of the P-type thin film transistors comprises a semiconductor layer including a P-type low concentration impurity region formed in a region other than a region below a gate electrode, a gate insulating film, and the gate electrode on the substrate in this order, and further comprises a sidewall spacer on a side surface of the gate electrode and a P-type high concentration impurity layer on the P-type low concentration impurity region, and wherein the P-type high concentration impurity layer is formed on the semiconductor layer in a region other than a region below the gate electrode and the sidewall spacer and contains a higher concentration of a P-type impurity together with an N-type impurity contained in the N-type low concentration impurity layer and the N-type high concentration impurity layer.

The present invention is mentioned in more detail below.

The semiconductor device of the present invention includes P-type and N-type thin film transistors (TFTs). In the present description, the P-type TFT means a TFT including a layer made of a p-type semiconductor, and the N-type TFT means a TFT including a layer made of an n-type semiconductor. As for the configuration of the semiconductor device of the present invention, the P-type TFT and the N-type TFT are not necessarily electrically connected but preferably electrically connected to each other. For example, the semiconductor device preferably has a CMOS (complementary circuit) including P-type TFTs and N-type TFTs.

Each of the above-mentioned P-type and N-type thin film transistors essentially includes low concentration and high concentration impurity layers or impurity regions having different impurity concentrations. That is, each of the P-type TFTs and the N-type TFTs of the present invention essentially includes two or more impurity semiconductor layers or regions having different impurity concentrations. In the present description, the terms "or more" and "or less" mean that the value described is included.

In the present description, the terms "low concentration" and "high concentration" in the low concentration and high concentration impurity layers or impurity regions simply mean that the concentration of impurities contained in one impurity layer or impurity region is relatively lower or higher than that of impurities contained in another impurity layer or impurity region. In the P-type TFTs and the N-type TFTs of the present invention, as long as it can be recognized that the low concentration impurity layer (low concentration impurity region) and the high concentration impurity layer have different impurity concentrations, the boundary of these layers (the layer and the region) is not necessarily clear. The above-mentioned impurity means an ion (atom) generating a carrier (positive hole or electron) inside the semiconductor. Generally, a positive hole is a carrier in the P-type impurity layer (impurity region) and an electron is a carrier in the N-type impurity layer (impurity region).

At least one of the above-mentioned N-type thin film transistors (hereinafter, also referred to as simply "N-type TFT") includes a semiconductor layer, a gate insulating film, and a gate electrode on a substrate in this order, and further includes a sidewall spacer formed on a side surface of the gate electrode and an N-type low concentration impurity layer and an N-type high concentration impurity layer (source or drain region) stacked on the semiconductor layer in a region other than a region below the gate electrode and the sidewall spacer. That is, the above-mentioned N-type TFT has a structure, so-called off-set gate structure, in which the offset region is included on the semiconductor layer in a region other than a region below the sidewall spacer, and an off-state current can be reduced.

It is preferable that the material of the above-mentioned N-type low concentration impurity layer is the same as that of the N-type high concentration impurity layer, and silicide which can be selectively grown such as silicon germanium (SiGe) is preferable. Examples of the impurity contained in the N-type low concentration impurity layer include phosphorus ion (atom). The concentration of the N-type impurity contained in the N-type low concentration impurity layer varies depending on the kind of the impurity, but is preferably 1E+14 ($1\times10^{14}$) ions/cm$^3$ or more and 1E+20 ($1\times10^{20}$) ions/cm$^3$ or less, specifically. It is preferable that the N-type low concentration impurity layer has a resistivity at 25° C. of 10 kΩ/□ or more and 10 MΩ/□ or less.

The above-mentioned N-type high concentration impurity layer is formed on the N-type low concentration impurity layer. Silicide which can be selectively grown such as silicon germanium (SiGe) is preferable as the material of the N-type high concentration impurity layer. Examples of the N-type impurity contained in the N-type high concentration impurity layer include phosphorus ion (atom). The concentration of the N-type impurity contained in the N-type high concentration impurity layer varies depending on the kind of the impurity, but is preferably 1E+18 ($1\times10^{18}$) ions/cm$^3$ or more and 1E+21 ($1\times10^{21}$) ions/cm$^3$ or less, specifically. It is preferable that the N-type high concentration impurity layer has a resistivity at 25° C. of 10 kΩ/□ or less.

At least one of the above-mentioned P-type thin film transistors (hereinafter, also referred to as simply "P-type TFT") includes a semiconductor layer including a P-type low concentration impurity region formed in a region other than a region below a gate electrode, a gate insulating film, and a gate electrode on the substrate in this order, and further includes a sidewall spacer formed on a side surface of the gate electrode and a P-type high concentration impurity layer on the P-type low concentration impurity region. That is, the above-mentioned P-type TFT has a structure, so-called LDD structure, in which a low concentration of the P-type impurity is added (ion-doped) into the offset region in the semiconductor layer, and therefore, the hot carrier-induced degradation can be reduced and simultaneously reliability of the semiconductor device can be maintained even if the channel length is shortened for improvement in field-effect mobility and clustering.

The above-mentioned P-type low concentration impurity region is formed in the semiconductor layer in a region other than a region below the gate electrode. As a result, the low concentration impurity region can be easily formed in a self-align manner using the gate electrode as a mask, and simultaneously a channel region can be formed. It is preferable that the material of the above-mentioned P-type low concentration impurity region is the same as that of the semiconductor layer for forming the P-type TFT and that of the P-type high concentration impurity layer. Silicide which can be selectively grown such as silicon germanium (SiGe) may be mentioned as the material. It is preferable that the P-type impurity contained in the P-type low concentration impurity region is the same as the P-type impurity contained in the P-type high concentration impurity layer. A boron ion (atom) and the like may be mentioned, for example. The concentration of the P-type impurity contained in the P-type low concentration impurity region varies depending on the kind of the impurity, but is preferably 1E+14 ($1\times10^{14}$) ions/cm$^3$ or more and 1E+20 ($1\times10^{20}$) ions/cm$^3$ or less, specifically. It is preferable that the P-type low concentration impurity layer has a resistivity at 25° C. of 10 kΩ/□ or more and 10 MΩ/□ or less.

The above-mentioned P-type high concentration impurity layer is formed on the semiconductor layer in a region other than a region below the gate electrode and the sidewall spacer, and contains the P-type impurity in higher concentrations, in addition to the N-type impurity contained in the N-type low concentration impurity layer and the N-type high concentration impurity layer. Such a P-type high concentration impurity layer can be formed by forming an N-type impurity layer in both the semiconductor layer for forming the N-type TFT and the semiconductor layer for forming the P-type TFT using an N-type impurity-containing material, and then injecting P-type impurities into the N-type impurity layer formed on the semiconductor layer for forming the P-type TFT, in preparation of the semiconductor device of the present invention. As a result, a step of injecting N-type impurity ions for forming the N-type low concentration impurity layer and the N-type high concentration impurity layer can be eliminated.

The above-mentioned P-type high concentration impurity layer is formed as a layer different from the semiconductor layer in which the P-type low concentration impurity region is formed. Therefore, the above-mentioned P-type high concentration impurity layer can suppress reduction in crystallinity in comparison to a P-type high concentration impurity formed by further injecting the P-type impurities into the P-type low concentration impurity region formed by injecting the P-type impurities into the semiconductor layer. In addition, the crystallinity of the above-mentioned P-type high concentration impurity layer can be sufficiently repaired through a step such as heat treatment step, because the semiconductor layer that is a low layer of the above-mentioned P-type high concentration impurity layer has a non-reduced crystallinity. As a result, a source or drain region with a low resistance can be formed, and therefore a semiconductor device including a TFT with high performances can be provided.

Silicide which can be selectively grown such as silicon germanium (SiGe) is preferable as the material of the above-mentioned P-type high concentration impurity layer. Examples of the P-type impurity contained in the P-type high concentration impurity region include a boron ion (atom). Examples of the impurity contained in the N-type low concentration impurity layer and the N-type high concentration impurity layer each included in the P-type high concentration impurity layer include a phosphorus ion (atom). The concentration of the P-type impurity contained in the P-type high concentration impurity layer varies depending on the kind of the impurity, but is higher than the concentration of the P-type impurity contained in the P-type low concentration impurity region. Specifically, it is preferable that the concentration of the P-type impurity is 1E+18 ($1 \times 10^{18}$) ions/cm$^3$ or more and 1E+21 ($1 \times 10^{21}$) ions/cm$^3$ or less. It is preferable that the P-type high concentration impurity layer has a resistivity at 25° C. of 10 k$\Omega$/□ or less.

The size of the above-mentioned N-type and P-type high concentration impurity layers is not especially limited, but it is preferable in view of suppression of junction barrier formation that the N-type and P-type high concentration impurity layers are formed to cover the N-type low concentration impurity layer and the P-type low concentration impurity region, respectively. Further, it is preferable in view of suppression of junction barrier formation that the N-type and P-type high concentration impurity layers are in ohmic contact with the N-type low concentration impurity layer and the P-type low concentration impurity region, respectively.

In the N-type and P-type TFTs included in the semiconductor device of the present invention, the film thickness of the semiconductor layer and that of the high concentration impurity layer can be arbitrarily controlled independently because the semiconductor layer including the channel region and the high concentration impurity layer that is a source or drain region are separately formed as an independent layer, as mentioned above. Therefore, the performances of the TFTs and the semiconductor device can be further improved by increasing the film thickness of the high concentration impurity layer, thereby lowering the electric resistance, or by decreasing the film thickness of the semiconductor layer, thereby improving the field-effect mobility in the channel region.

The above-mentioned semiconductor layer for forming the N-type TFT is formed on the substrate and consists of the offset region and the channel region. The channel region of the N-type TFT is generally formed in the semiconductor layer in a region below the gate electrode. The offset region of the N-type TFT is generally formed in the semiconductor layer in a region other than a region below the gate electrode. The material of the above-mentioned semiconductor layer may be amorphous silicon and microcrystal silicon, but is preferably polycrystal silicon, CG silicon (continuous grain boundary crystal silicon), and the like because a higher field-effect mobility can be obtained and a film formation through a low temperature process can be performed. Further, the material of the semiconductor layer may contain germanium (Ge), nickel (Ni), phosphorus (P), boron (B), arsenic (As), and the like. The offset region and the channel region may contain a low concentration impurity unless the functional effects of the present invention are sacrificed, if the semiconductor layer for forming the N-type TFT consists of the offset region and the channel region. However, it is preferable in view of effective reduction in off-state current that the offset region is formed of an intrinsic semiconductor.

The above-mentioned semiconductor layer for forming the P-type TFT is formed on the substrate and includes the P-type low concentration impurity region formed in a region other than a region below the gate electrode and consists of the channel region and the P-type low concentration impurity region. The channel region of the P-type TFT is generally formed in the semiconductor layer in a region below the gate electrode. The P-type low concentration impurity region is generally formed in the semiconductor layer in a region below the sidewall spacer. In view of reduction in off-state current, the above-mentioned channel region is preferably a region where the concentration of the impurities (impurity ion-doped amount) contained in the semiconductor is lowest in the semiconductor layer, and more preferably formed of an intrinsic semiconductor. However, the channel region may be formed of an impurity semiconductor containing the same impurity in the same concentration as those in the low concentration impurity region, or may be formed of an impurity semiconductor containing a specific concentration of an impurity different from that in the low concentration impurity region.

It is preferable for simultaneous formation of the semiconductor layer for forming the N-type TFT that the material of the semiconductor layer for forming the P-type TFT is the same as that of the semiconductor layer for forming the N-type TFT. The channel region in the semiconductor layer for forming the P-type TFT has a field-effect mobility of 30 cm$^2$/V·sec or more. The size of the channel region is not especially limited, but the width thereof (so-called channel length) is preferably 3 μm or less for higher field-effect mobility and clustering.

The above-mentioned semiconductor layers for forming the P-type and N-type TFTs preferably have an island shape. The size of the semiconductor layers for forming the P-type and N-type TFTs is not especially limited. However, the thinner the semiconductor layer is, the better for higher field-effect mobility in the channel region.

The above-mentioned gate insulating film is formed between the semiconductor layer and the gate electrode. Silicon dioxide (SiO$_2$), silicon nitride (SiNx), tantalum oxide, aluminum oxide, and the like are preferable as the material of the gate insulating film. The size of the gate insulating film is not especially limited. The preferable embodiment of the gate insulating film is an embodiment in which the gate insulating film is below the gate electrode and the side wall spacer. The more preferable embodiment is an embodiment in which the gate insulating film is only below the gate electrode and the side wall spacer. The gate insulating film in such an embodiment is preferable for simplification of the production steps of the semiconductor device because such a gate insulating film can be pattern-formed in the step of forming the sidewall spacer.

The above-mentioned gate electrode is provided on the gate insulating film. Examples of a preferable material of the gate electrode include high melting point metals such as tungsten (W), molybdenum (Mo), tantalum (Ta), and titanium (Ti), and nitrides of such high melting point metals. The configuration of the gate electrode is not especially limited, and a stacked body of two or more materials may be used. The size of the gate electrode is not especially limited, but generally, the thicker the film thickness of the gate electrode is, the better for reduction in electric resistance.

When the semiconductor device of the present invention is produced, this gate electrode is used as a mask in the step of injecting the P-type impurity, thereby forming the P-type low concentration impurity region for forming the P-type TFT and the N-type TFT. As a result, the P-type low concentration impurity region can be easily formed in a self-align manner.

The above-mentioned side wall spacer is formed on the side surfaces of the gate electrode. Silicon dioxide ($SiO_2$) and the like may be mentioned as the material of the side wall spacer. The size of the sidewall spacer is not especially limited, but generally, the width thereof is the same as a distance from the gate electrode terminal to the gate insulating film terminal, and the thickness thereof is generally the same as that of the gate electrode.

When the semiconductor device of the present invention is produced, not only the gate electrode but also this sidewall spacer is used as a mask in the step of forming the N-type low concentration impurity layer, the N-type high concentration impurity layer, and the P-type high concentration impurity layer. As a result, such layers can be easily formed in a self-align manner. At this time, in the N-type TFT, the width of the sidewall spacer is the same as the offset length in the semiconductor layer, and in the P-type, the width thereof is the same as the offset length in the semiconductor layer into which the low concentration impurity is added. Accordingly, the performances of the TFTs can be controlled by controlling the width of the sidewall spacer. It is preferable for the functional effects of the present invention that the sidewall spacer has a width of 1 nm or more and 1 µm or less.

The semiconductor device of the present invention may or may not include other components and is not especially limited as long as the semiconductor device essentially includes such components. Examples of a preferable embodiment of the semiconductor device of the present invention include an embodiment in which the semiconductor device further includes an N-type thin film transistor with a LDD structure (hereinafter, referred to as "N-type TFT-LDD") and/or a P-type thin film transistor with an offset gate structure (hereinafter, referred to as "P-type TFT-OFF"), in addition to the above-mentioned P-type TFT (hereinafter, referred to as "P-type TFT-LDD") and the above-mentioned N-type TFT (hereinafter, referred to as "N-type TFT-OFF"). Semiconductor devices in such embodiments can exhibit the above-mentioned functional effects of the present invention, and can be preferably used as a component of monolithic liquid crystal displays.

Embodiments of the semiconductor device including the above-mentioned P-type TFT-LDD, N-type TFT-OFF, and N-type TFT-LDD include an embodiment in which: each of the P-type TFT-LDD, the N-type TFT-OFF, and the N-type TFT-LDD essentially includes low concentration and high concentration impurity layers or impurity regions having different impurity concentrations; the above-mentioned N-type TFT-OFF includes a semiconductor layer, a gate insulating film, and a gate electrode on a substrate in this order, and further includes a sidewall spacer formed on a side surface of the gate electrode, and an N-type low concentration impurity layer and an N-type high concentration impurity layer stacked on the semiconductor layer in a region other than a region below the gate electrode and the sidewall spacer; the above-mentioned P-type TFT-LDD includes a semiconductor layer including a P-type low concentration impurity region formed in a region other than a region below the gate electrode, a gate insulating film, and the gate electrode on the substrate in this order, and further includes a sidewall spacer on a side surface of the gate electrode and a P-type high concentration impurity layer on the P-type low concentration impurity layer, and the above-mentioned P-type high concentration impurity layer is formed on the semiconductor layer in a region other than a region below the gate electrode and the sidewall spacer and contains a higher concentration of a P-type impurity together with an N-type impurity contained in the N-type low concentration impurity layer and the N-type high concentration impurity layer; and the above-mentioned N-type TFT-LDD includes a semiconductor layer including an N-type low concentration impurity region formed in a region other than a region below a gate electrode, a gate insulating film, and the gate electrode on the substrate in this order, and further includes a sidewall spacer formed on a side surface of the gate electrode, and an N-type low concentration impurity layer and an N-type high concentration impurity layer stacked on the semiconductor layer in a region other than a region below the gate electrode and the sidewall spacer. The semiconductor device in such an embodiment is preferable for simplification of production steps of a monolithic liquid crystal display because such a semiconductor device can be produced just by additionally performing a step of injecting the N-type impurity into the semiconductor layer for forming the N-type TFT-LDD in the production steps of the semiconductor device including the P-type TFT-LDD and the N-type TFT-OFF. In this N-type TFT-LDD, the boundary between the low concentration impurity region and the low concentration impurity layer, and the boundary between the low concentration impurity layer and the high concentration impurity layer are not necessarily clear.

Embodiments of the semiconductor device including the above-mentioned P-type TFT-LDD, N-type TFT-OFF, and P-type TFT-OFF include an embodiment in which: each of the above-mentioned P-type TFT-LDD, N-type TFT-OFF, and P-type TFT-OFF essentially includes low concentration and high concentration impurity layers or impurity regions having different impurity concentrations; the above-mentioned N-type TFT-OFF includes a semiconductor layer, a gate insulating film, and a gate electrode on a substrate in this order, and further includes a sidewall spacer formed on a side surface of the gate electrode, and an N-type low concentration impurity layer and an N-type high concentration impurity layer stacked on the semiconductor layer in a region other than a region below the gate electrode and the sidewall spacer; the above-mentioned P-type TFT-LDD includes a semiconductor layer including a P-type low concentration impurity region formed in a region other than a region below the gate electrode, a gate insulating film, and the gate electrode on the substrate in this order, and further includes a sidewall spacer on a side surface of the gate electrode and a P-type high concentration impurity layer on the P-type low concentration impurity layer, and the above-mentioned P-type high concentration impurity layer is formed on the semiconductor layer in a region other than a region below the gate electrode and the sidewall spacer and contains a higher concentration of a P-type impurity together with an N-type impurity contained in the N-type low concentration impurity layer and the N-type high concentration impurity layer; and the above-mentioned P-type TFT-OFF includes a semiconductor layer including a P-type low concentration impurity region formed in a region other than a region below a gate electrode and a side wall spacer, a gate insulating film, and the gate electrode on the substrate in this order, and further includes the sidewall spacer formed on a side surface of the gate electrode, and a P-type high concentration impurity layer stacked on the semiconductor layer in a region other than a region below the gate electrode and the sidewall spacer, and the above-mentioned P-type high concentration impurity layer contains a higher concentration of the P-type impurity together with the N-type impurity contained in the N-type low concentration impurity layer and the N-type high concentration impurity layer. The semiconductor device in such an embodiment is preferable for simplification of production steps of a monolithic liquid crystal display because such a semiconductor device can be produced just by additionally performing a step of injecting the P-type impurity in the semiconductor layer for forming the P-type TFT-OFF in the production steps of the semiconductor device including the P-type TFT-LDD and the N-type TFT-OFF. Also in this P-type TFT-OFF, the boundary between the low concentration impurity region and the high concentration impurity layer is not necessarily clear.

The present invention is also a semiconductor device comprising P-type thin film transistors and N-type thin film transistors, each of the P-type thin film transistors and the N-type thin film transistors comprising low concentration and high concentration impurity layers or impurity regions having different impurity concentrations, wherein at least one of the P-type thin film transistors comprises a semiconductor layer, a gate insulating film, and a gate electrode on a substrate in this order, and further comprises a sidewall spacer formed on a side surface of the gate electrode, and a P-type low concentration impurity layer and a P-type high concentration impurity layer stacked on the semiconductor layer in a region other than a region below the gate electrode and the sidewall spacer, and wherein at least one of the N-type thin film transistors comprises a semiconductor layer including an N-type low concentration impurity region formed in a region other than a region below a gate electrode, a gate insulating film, and the gate electrode on the substrate in this order, and further comprises a sidewall spacer on a side surface of the gate electrode and an N-type high concentration impurity layer on the N-type low concentration impurity region, and wherein the N-type high concentration impurity layer is formed on the semiconductor layer in a region other than a region below the gate electrode and the sidewall spacer and contains a higher concentration of an N-type impurity together with a P-type impurity contained in the P-type low concentration impurity layer and the P-type high concentration impurity layer.

This semiconductor device has the same configuration as in the above-mentioned semiconductor device of the present invention, except that the relationship between the conductive type and the structure of the TFTs included as an essential component is opposite. Therefore, the semiconductor device of the present invention in accordance with such a configuration can exhibit the same functional effects as in the semiconductor device of the present invention having the above-mentioned configuration. The preferable embodiments and the like are also the same as in the semiconductor device of the present invention having the above-mentioned configuration, except that the relationship between the conductive type and the structure of the TFTs included as a component is opposite.

The present invention is also a production method of a semiconductor device comprising a P-type thin film transistor and an N-type thin film transistor, the production method comprising the steps of:
forming a semiconductor layer on a substrate;
forming a gate insulating film on the semiconductor layer;
forming a gate electrode on the gate insulating film;
forming a P-type low concentration impurity region in the semiconductor layer for forming the P-type thin film transistor using the gate electrode as a mask;
forming a sidewall spacer on a side surface of the gate electrode and simultaneously etching the gate insulating film;
forming an N-type low concentration impurity layer and an N-type high concentration impurity layer successively on the semiconductor layer for forming the P-type thin film transistor and the N-type thin film transistor using the gate electrode and the sidewall spacer as a mask;
injecting a P-type impurity into the N-type low concentration impurity layer and the N-type high concentration impurity layer for forming the P-type thin film transistor, thereby forming a P-type high concentration impurity layer.

In the above-mentioned step of forming the semiconductor layer, it is preferable that the semiconductor material is patterned into an island shape by a plasma chemical vapor deposition (CVD) method, a low-pressure CVD method, and the like. Amorphous silicon, microcrystal silicon and polycrystal silicon are preferable as the above-mentioned semiconductor material, and further germanium (Ge), nickel (Ni), phosphorus (P), boron (B), arsenic (As) and the like may be contained. It is preferable that the semiconductor layer is formed and then heat-treated for activation of the ions contained in the semiconductor layer. Examples of a method of the heat treatment include a furnace annealing method, a lamp annealing method, and a laser annealing method.

In the above-mentioned step of forming the gate insulating film, it is preferable that the insulating material is formed as a film to cover the semiconductor layer by a sputtering method, a normal pressure CVD method, a low pressure CVD method, a plasma CVD method, a remote plasma CVD method, and the like. Examples of the above-mentioned insulating material include silicon dioxide ($SiO_2$), silicon nitride (SiNx), tantalum oxide, and aluminum oxide.

It is preferable that a metal film is formed by a sputtering method and the like in the above-mentioned step of forming the gate electrode. Examples of a preferable material of the above-mentioned metal film include high melting point metals such as tungsten (W), molybdenum (Mo), tantalum (Ta), and titanium (Ti), and nitrides of such high melting point metals.

In the above-mentioned step of forming the P-type low concentration impurity region, it is preferable that the impurity ions are injected into the semiconductor layer for forming the P-type TFT by an ion-implantation method, an ion-doping method, and the like. As a result, the P-type low concentration impurity region can be formed in a self-align manner using the gate electrode as a mask. When the P-type low concentration impurity region is formed by an ion-implantation method and the like, it is preferable that a step of covering the semiconductor layer on the N-type TFT side with a resist and the like is performed before the ion injection. A boron ion and the like may be mentioned as the impurity ion injected into the semiconductor layer on the P-type TFT side. An ion-doping method is preferable if the impurity ion is injected through a low temperature process.

In the above-mentioned step of etching the gate insulating film, it is preferable that the insulating film serving as the sidewall spacer and the gate insulting film are anisotropically etched by a reactive ion etching (RIE) method in which an isotropy is strongly shown in the vertical direction. As a result, the gate insulating film can be formed below the gate electrode and the sidewall spacer. Silicon dioxide ($SiO_2$) and the like may be mentioned as a material of the above-mentioned insulating film serving as the sidewall spacer. A dry etching process is preferable as the anisotropic etching process.

In the above-mentioned step of forming the N-type low concentration impurity layer and the N-type high concentration impurity layer, it is preferable that a film of an N-type impurity-containing semiconductor material is formed by a selective growth method, and the like. At this time, the film formation is performed while the concentration of the N-type impurity is varied, and thereby the N-type low concentration impurity layer and the N-type high concentration impurity layer can be successively formed. Use of the selective growth method and the like permits elimination of the step of injecting the N-type impurity, which has been conventionally performed for forming the N-type low concentration impurity layer and the N-type high concentration impurity layer. Therefore, the semiconductor device can be produced simply and inexpensively. In addition, N-type TFTs with high performances and high reliability including a source or drain with a low resistance can be formed. This is because the N-type high concentration impurity layer is formed using a material previously having a conductive type of N and thereby the injection of the impurity ion can be prevented from damaging the N-type high concentration impurity layer, and the crystallinity of the N-type high concentration impurity can be sufficiently improved by the heat treatment.

It is preferable that the above-mentioned N-type low concentration impurity layer and the above-mentioned N-type high concentration impurity layer are formed to cover the semiconductor layers for forming the P-type and N-type thin film transistors.

In the above-mentioned step of forming the P-type high concentration impurity layer, it is preferable that the P-type impurity ion is injected into the N-type low concentration impurity layer and the N-type high concentration impurity layer on the semiconductor layer for forming the P-type TFT by an ion-implantation method, an ion-doping method, and the like. It is preferable that a step of performing a heat treatment is performed to activate the impurity and recover crystallinity of the semiconductor layer. Examples of a method of the heat treatment include a furnace annealing method, a lamp annealing method, and a laser annealing method.

A boron ion and the like may be mentioned as the impurity ion injected into the N-type low concentration impurity layer and the N-type high concentration impurity layer on the semiconductor layer for forming the P-type TFT. An ion-doping method is preferable when the impurity ion is injected through a low temperature process.

According to the production method of the semiconductor device of the present invention, the semiconductor layer and the high concentration impurity layer are formed separately as an independent layer in each of the P-type and N-type TFTs. Therefore, the field-effect mobility can be increased by reducing the thickness of the semiconductor layer, or the resistance of the source or drain can be reduced by increasing the high concentration impurity layer.

Examples of a preferable production method of the semiconductor device of the present invention include a production method of a semiconductor device including an N-type thin film transistor with a LDD structure (hereinafter, referred to as "N-type TFT-LDD") and/or a P-type thin film transistor with an offset gate structure (hereinafter, referred to as "P-type TFT-OFF"), in addition to the above-mentioned P-type TFT (hereinafter, referred to as "P-type TFT-LDD") and the above-mentioned N-type TFT (hereinafter, referred to as "N-type TFT-OFF").

Examples of the production method of the above-mentioned semiconductor device including the P-type TFT-LDD, the N-type-OFF, and the N-type TFT-LDD include, as shown in FIG. 2, a production method including the steps of: forming a semiconductor layer 3 on a substrate 1 (FIG. 2(a)); forming a gate insulating film 4 on the semiconductor layer 3 (FIG. 2(b)); forming a gate electrode 6 on the gate insulating film 4 (FIG. 2(c)); forming a P-type low concentration impurity region 13 in the semiconductor layer for forming a P-type TFT-LDD using the gate electrode 6 as a mask (FIG. 2 (d)); forming an N-type low concentration impurity region 17a in the semiconductor layer for forming an N-type TFT-LDD using the gate electrode 6 as a mask (FIG. 2(e)); forming a sidewall spacer 16 on a side surface of the gate electrode 6 and simultaneously etching the gate insulating film 4 (FIGS. 2(f) and (g)); forming an N-type low concentration impurity layer 17a and an N-type high concentration impurity layer 17b successively on the semiconductor layers for forming the P-type TFT-LDD, an N-type TFT-OFF, and the N-type TFT-LDD using the gate electrode 6 and the sidewall spacer 16 as a mask (FIG. 2 (h)); injecting a P-type impurity into the N-type low concentration impurity layer 17a and the N-type high concentration impurity layer 17b for forming the P-type TFT-LDD, thereby forming a P-type high concentration impurity layer 20 (FIG. 2(i)) According to this production method, at least three thin film transistors having different characteristics can be simultaneously produced by simple steps, and therefore can be preferably used as a production method of monolithic liquid crystal displays.

Examples of the production method of the above-mentioned semiconductor device including the P-type TFT-LDD, the N-type TFT-OFF, and the P-type TFT-OFF include, as shown in FIG. 3, a production method including the steps of: forming a semiconductor layer 3 on a substrate 1 (FIG. 3(a)); forming a gate insulating film 4 on the semiconductor layer 3 (FIG. 3(b)); forming a gate electrode 6 on the gate insulating film 4 (FIG. 3(c)); forming a P-type low concentration impurity region 13 in the semiconductor layer for forming a P-type TFT-LDD using the gate electrode 6 as a mask (FIG. 3(d)); forming a sidewall spacer 16 on a side surface of the gate electrode 6 and simultaneously etching the gate insulating film 4 (FIGS. 3(e) and (f)); forming a P-type low concentration impurity region 13 in the semiconductor layer for forming a P-type TFT-OFF using the gate electrode 6 and the side wall spacer 16 as a mask (FIG. 3 (g)); forming an N-type low concentration impurity layer 17a and an N-type high concentration impurity layer 17b successively on the semiconductor layers for forming the P-type TFT-LDD, an N-type TFT-OFF, and the P-type TFT-OFF using the gate electrode 6 and the sidewall spacer 16 as a mask (FIG. 3(h)); injecting a P-type impurity into the N-type low concentration impurity layer 17a and the N-type high concentration impurity layer 17b for forming the P-type TFT-LDD and the P-type TFT-OFF, thereby forming a P-type high concentration impurity layer 20 (FIG. 3(i)). According to this production method, at least three thin film transistors having different characteristics can be simultaneously produced by simple steps, and therefore can be preferably used as a production method of monolithic liquid crystal display devices.

The present invention is also a production method of a semiconductor device comprising a P-type thin film transistor and an N-type thin film transistor, the production method comprising the steps of:

forming a semiconductor layer on a substrate;

forming a gate insulating film on the semiconductor layer;

forming a gate electrode on the gate insulating film;

forming an N-type low concentration impurity region in the semiconductor layer for forming the N-type thin film transistor using the gate electrode as a mask;

forming a sidewall spacer on a side surface of the gate electrode and simultaneously etching the gate insulating film;

forming a P-type low concentration impurity layer and a P-type high concentration impurity layer successively on the semiconductor layer for forming the P-type thin film transistor and the N-type thin film transistor using the gate electrode and the sidewall spacer as a mask;

injecting an N-type impurity into the P-type low concentration impurity layer and the P-type high concentration impurity layer for forming the N-type thin film transistor, thereby forming an N-type high concentration impurity layer. This production method of the semiconductor device is the same as the above-mentioned production method of the semiconductor device of the present invention, except that the relationship between the conductive type and the structure of the TFTs included as an essential component is opposite. Therefore, also such a production method of the semiconductor device of the present invention can exhibit the same functional effects as in the above-mentioned production method of the semiconductor of the present invention. The preferable methods and the like are also the same as in the above-mentioned semiconductor device of the present invention, except that the relationship between the conductive type and the structure of the TFTs included as a component is opposite.

The present invention is further a thin film transistor array substrate comprising the semiconductor device or a semiconductor device produced by the production method of the semiconductor device. According to the TFT array substrate of the present invention, a TFT array substrate including the semiconductor device of the present invention or a semiconductor device produced by the production method of the semiconductor of the present invention, that is, a semiconductor device which has high performances and high reliability and can be produced simply and inexpensively. Such a TFT substrate can be used as a driving circuit substrate and the like, and it is preferably used as an active matrix substrate in a liquid crystal display device, and particularly preferably used as a component of a monolithic liquid crystal display. If the TFT array substrate of the present invention is used as a component of a monolithic liquid crystal display, it is preferable that a TFT with an offset gate structure is used as a pixel switching element for which a low off-state current is needed and that a TFT with a LDD structure is used as a switching element in a driving circuit for which a high on-state current is needed and that both of the TFTs are used in a CMOS circuit. In the TFT array substrate of the present invention, the arrangement place, the arrangement embodiment, and the like of the semiconductor device of the present invention is not especially limited.

The present invention is also a liquid crystal display device comprising the thin film transistor array substrate. According to the liquid crystal display device of the present invention, a liquid crystal display device including a semiconductor device which has high performances and high reliability and can be produced simply and inexpensively can be provided. The application of the liquid crystal display device of the present invention is not especially limited.

EFFECT OF THE INVENTION

The semiconductor device of the present invention includes a TFT with an offset gate structure and a TFT with a LDD structure, and therefore can reduce both an off-state current and hot carrier-induced degradation. A semiconductor layer including a channel region and a high concentration impurity layer for forming a source or drain region, each layer being a component of the semiconductor device, are separately formed as an independent layer. Therefore, such a semiconductor device is configured to improve performances of thin film transistors and to be produced simply and inexpensively.

BEST MODES FOR CARRYING OUT THE INVENTION

The present invention is mentioned below in more detail with reference to Embodiments, but the present invention is not limited to only these Embodiments.

Embodiment 1

FIG. 1 is a cross-sectional view schematically showing a production method of a semiconductor device in accordance with one Embodiment of the present invention.

A semiconductor layer 3 was first formed on a substrate 1, as shown in FIG. 1(a). A quartz substrate, a glass substrate, and a glass substrate covered with an insulating film may be used as this substrate 1. In this Embodiment, a glass substrate covered with an insulating layer 2 was used. Examples of the semiconductor layer 3 include semiconductor films made of amorphous silicon, microcrystal silicon, polycrystal silicon, and the like. The semiconductor layer 3 may be formed of a material containing germanium (Ge), nickel (Ni), phosphorus (P), boron (B), arsenic (As) and the like, in addition to the above-mentioned material.

If a single crystal silicon substrate is used as the substrate 1, there is no need to form the semiconductor layer 3, and the single crystal silicon substrate itself can be used as the semiconductor layer 3.

A film of the above-mentioned semiconductor layer 3 can be formed to have a thickness of 10 to 200 nm by film-formation methods such as a plasma CVD (Chemical Vapor Deposition) method and a LPCVD (Low Pressure CVD) method. For example, the polycrystal silicon film can be directly formed on the substrate 1 at a substrate temperature of 580 to 650° C. by a LPCVD method. A more excellent polycrystal silicon film can be formed by annealing an amorphous silicon film, which is formed at a substrate temperature of 400 to 600° C. by the LPCVD method, in vacuum or inert gas at 500 to 650° C. for 6 to 48 hours. The amorphous silicon film can be formed by the plasma CVD method, and $SiH_4$ and $Si_2H_6$ can be used as a raw material gas. The amorphous silicon film may be annealed by a lamp annealing method or a laser annealing method.

Then, the semiconductor layer 3 was etched into an island shape. Then, a gate insulating film 4 was formed on the semiconductor layer 3. This gate insulating film 4 can be formed by a sputtering method, a normal pressure CVD method, a LPCVD method, a plasma CVD method, a remote plasma CVD method, and the like. In this Embodiment, a SiO$_2$ film with a film thickness of 5 to 150 nm was formed as the gate insulating film 4. In addition, insulating films such as a silicon nitride film, an oxidized tantalum film, and an oxidized aluminum film, may be used as the gate insulating film 4.

Then, a gate electrode 6 was formed as shown in FIG. 1 (c). Examples of the gate electrode 6 include high melting point metals, such as tungsten (W), molybdenum (Mo), tantalum (Ta), and titanium (Ti), nitride films of these high melting point metals, and stacked two or more different materials. In the present Embodiment, a W film with a film thickness of 200 to 400 nm formed by a sputtering method was used as the gate electrode 6.

Then, as shown in FIG. 1 (d), a resist 11 was formed so that an impurity ion 12 can be injected only into a region for forming a P-type thin film transistor (TFT), and then an impurity ion 12 was injected in a self-alignment manner using the gate electrode 6 as a mask. As a result, a P-type low concentration impurity region 13 was formed in the semiconductor layer 3. A channel region 14 was formed in the semiconductor layer 3 at a portion below the gate electrode 6 because the impurity ion 12 was not injected into the portion. The impurity ion 12 was not injected into a region for forming an N-type thin film transistor because the region was covered with the resist 11. In the present Embodiment, a boron ion as the impurity ion 12 was injected at an energy level of 5 to 100 keV and a dose amount of $3 \times 10^{13}$ ions/cm$^2$.

Then, a first interlayer insulating film 15 was formed as shown in FIG. 1(e). In the present Embodiment, a SiO$_2$ film with a film thickness of 50 to 2000 nm was formed as the first interlayer insulating film 15.

Then, as shown in FIG. 1(f), the first interlayer insulating film 15 and the gate insulating film 4 were anisotropically etched, and thereby a sidewall spacer 16 was formed on side surfaces of the gate electrode 6 and simultaneously the gate insulating film 4 was patterned.

Then, as shown in FIG. 1 (g), an N-type low concentration impurity layer 17a and an N-type high concentration impurity layer 17b were selectively formed in a portion not covered with the gate insulating film 14 on the P-type low concentration impurity region 13 and in a portion not covered with the gate insulating film 4 on the semiconductor layer for forming the N-type TFT. In the present Embodiment, SiGe films with a film thickness of 5 to 200 nm were successively formed as the low concentration impurity layer 17a and the high concentration impurity layer 17b in this order by changing the impurity concentration. The portion covered with the gate insulating layer 4 in the semiconductor layer 3 for forming the N-type TFT serves as a channel region. The portion covered with the low concentration impurity layer 17a in the semiconductor layer 3 for forming the N-type TFT serves as an offset region. In the present Embodiment, a film containing 1 to 40 atom % of Ge and 1E16 ($1 \times 10^{16}$) to 1E18 ($1 \times 10^{18}$) ions/cm$^3$ of phosphorus as the impurity was formed as the high concentration impurity layer 17a. A film containing 1 to 40 atom % of Ge and 1E17 ($1 \times 10^{17}$) to 1E20. ($1 \times 10^{20}$) ions/cm$^3$ of phosphorus as the impurity was formed as the high concentration impurity layer 17b.

Then, as shown in FIG. 1(h), a resist 18 was formed so that an impurity ion 19 can be injected only into the region for forming the P-type TFT, and then the impurity ion 19 was injected into the N-type low concentration impurity layer 17a and the N-type high concentration impurity layer 17b. As a result, a P-type high concentration impurity region 20 was formed. The impurity ion 19 was not injected into the region for forming the N-type TFT because the region was covered with the resist 18. In the present Embodiment, a boron ion as the impurity ion 19 was injected at an energy level of 5 to 100 keV and a dose amount of $5 \times 10^{16}$ ions/cm$^2$. Then, the impurity ion 12 in the P-type low concentration impurity region 13 and the impurity ion 19 in the P-type high concentration impurity region 20 were activated. This activation may be performed by a furnace annealing method, a lamp annealing method, a laser annealing method, or a self-activity method.

Finally, as shown in FIG. 1(i), a second interlayer insulating film 21 was formed and then, a contact hole, source and drain wirings 22 were formed and then a third insulating film 23 was formed.

According to the production method of the semiconductor device of the present Embodiment, the N-type TFT with an offset gate structure and the P-type TFT with a LDD structure can be formed and therefore an off-state current and hot carrier-induced degradation could be simultaneously reduced. The low concentration impurity region 13, the low concentration impurity layer 17a, and the high concentration impurity layers (source and drain) 17b and 20 could be easily formed in a self-alignment manner. Further, the N-type low concentration impurity layer 17a and the high concentration impurity layer 17b were formed of a material of which the conductivity type is predetermined, and thereby the ion injection step and the resist pattern-forming step each for forming the layers 17a and 17b could be eliminated. In the high concentration impurity layer 17b in the N-type TFT, damage by injection of the impurity ion is prevented and simultaneously the crystallinity of the high concentration impurity layers 17b and 20 could be sufficiently improved by the heat treatment because the low concentration impurity regions 13 and 17a having no reduced crystallinity existed below the high concentration impurity layers 17b and 20 in N-type and P-type TFTs.

According to the production method of the semiconductor device of present Embodiment, the semiconductor layer 3 including the channel region 14 and the high concentration impurity layers 17b and 20 were separately formed as an independent layer. Therefore, the film thickness of each layer can be arbitrarily determined independently. Accordingly, the semiconductor layer 3 is thinned for increase in field-effect mobility of the channel regions 9 and 14, or the high concentration impurity layers 17b and 20 are thickened for decrease in resistance in the source or drain region.

The production method of the semiconductor device of the present invention is mentioned above. The production method of the semiconductor device of the present invention is not especially limited to Embodiment 1, and may be variously changed. Embodiment 1 mentioned the production method of the semiconductor device in which the N-type TFT including the n$^+$ high concentration impurity layer 17b and the n$^-$ low concentration impurity layer 17a, and the P-type TFT including the p$^+$ high concentration impurity layer and the p$^-$ low concentration impurity region 13 were formed. For example, the production method may be a production method of a semiconductor device in which a P-type TFT including a p$^+$ high concentration impurity layer 17b and a p$^-$ low concentration impurity layer 17a, and a N-type TFT including an n$^+$ high concentration impurity layer 20 and an n$^-$ low concentration impurity region 13 are formed. Various insulating film materials such as silicon oxide, silicon nitride, tantalum oxide, and aluminum oxide may be used as the insulating film material for forming the gate insulating film 4, the first interlayer insulating film 15, the second interlayer insulating film 21, and the third insulating film 23. A stacking structure of these films may be also adopted. A SiGe film was formed as the low concentration impurity layer 17a and the high concentration impurity layer 17b, but the material is not especially limited as long as it is silicide which can be selectively grown. The film thickness of the gate insulating film 4, the first interlayer insulating film 15, the second interlayer insulating film 21, and the third insulating film 23, the channel length, the width of the semiconductor layer 3, and the size of each part of the TFT can be appropriately changed depending on the application.

Reference Embodiment 1

FIGS. 4(a) to (j) are cross-sectional views showing a production method of a semiconductor device in Reference Embodiment.

As shown in FIG. 4 (a), a semiconductor layer 3 was formed on a substrate 1. A quartz substrate, a glass substrate, and a glass substrate covered with an insulating film may be used as this substrate 1. In this Embodiment, a glass substrate 1 covered with an insulating film 2 was used. Examples of the semiconductor layer 3 include semiconductor films made of amorphous silicon, microcrystal silicon, polycrystal silicon, and the like. The semiconductor layer 3 also may be formed of such semiconductor films further containing a germanium (Ge), nickel (Ni), phosphorus (P), boron (B), arsenic (As) and the like. If a single crystal silicon substrate is used as the substrate 1, there is no need to form the semiconductor layer 3, and the single crystal silicon substrate can be used as it is as the semiconductor layer 3.

The semiconductor layer 3 can be formed to have a thickness of 10 to 200 nm by a plasma Chemical Vapor Deposition (CVD) method, a Low Pressure CVD (LPCVD) method, and the like. For example, the polycrystal silicon film can be directly formed on the substrate 1 at a substrate temperature of 580 to 650° C. by a LPCVD method. A more excellent polycrystal silicon film can be formed by annealing an amorphous silicon film, which is formed at a substrate temperature of 400 to 600° C. by a LPCVD method, in vacuum or inert gas at 500 to 650° C. for 6 to 48 hours. The amorphous silicon film can be formed by a plasma CVD method, and $SiH_4$ and $Si_2H_6$ can be used as a raw material gas. The amorphous silicon film may be annealed by a lamp annealing method or a laser annealing method.

Then, the semiconductor layer 3 was etched into an island shape. Then, a gate insulating film 4 was formed on the semiconductor layer 3. This gate insulating film 4 can be formed by a sputtering method, a normal pressure CVD method, a LPCVD method, a plasma CVD method, a remote plasma CVD method, and the like. In this Reference Embodiment, a $SiO_2$ film with a film thickness of 5 to 150 nm was formed as the gate insulating film 4. In addition, insulating films such as a silicon nitride (SiNx) film, an oxidized tantalum film, and an oxidized aluminum film, may be used as the gate insulating film 4.

Then, a gate electrode 6 was formed as shown in FIG. 4 (c). Examples of the gate electrode 6 include high melting point metals, such as tungsten (W), molybdenum (Mo), tantalum (Ta), and titanium (Ti), nitride films of these high melting point metals, and stacked two or more different materials. In the present Reference Embodiment, a W film with a film thickness of 200 to 400 nm was formed by a sputtering method as the gate electrode.

Then, as shown in FIG. 4 (d), a resist 10 was formed so that an impurity ion 7 can be injected only into a region for forming an N-type thin film transistor (TFT), and then the impurity ion 7 was injected in a self-alignment manner using the gate electrode 6 as a mask. A channel region (a part of the semiconductor region) 9 was formed in the semiconductor layer 3 in a portion below the gate electrode 6 because the impurity ion 7 was not injected into the portion. The impurity ion 7 was not injected into a region for forming the P-type TFT because the region was covered with the resist 10. In the present Reference Embodiment, a phosphorus ion as the impurity ion 7 was injected at an energy level of 5 to 100 keV and a dose amount of $3 \times 10^{13}$ ions/cm$^2$.

Then, as shown in FIG. 4(e), a resist 11 was formed so that an impurity ion 12 can be injected only into the region for forming the P-type TFT, and then the impurity ion 12 was injected in a self-align manner using the gate electrode 6 as a mask. As a result, a P-type low concentration impurity region 13 was formed in the semiconductor layer 3. A channel region (a part of the semiconductor region) 14 was formed in the semiconductor layer 3 at a portion below the gate electrode 6 because the impurity ion 12 was not injected into the portion. Further, the impurity ion 12 was not injected into the region for forming the N-type thin film transistor because the region was covered with the resist 11. In the present Reference Embodiment, a boron (B) ion as the impurity ion 12 was injected at an energy level of 5 to 100 keV and a dose amount of $3 \times 10^{13}$ ions/cm$^2$.

Then, a first interlayer insulating film 15 was formed as shown in FIG. 4 (f). In the present Embodiment, a $SiO_2$ film with a film thickness of 50 to 2000 nm was formed as the first interlayer insulating film 15.

Then, as shown in FIG. 4(g), the first interlayer insulating film 15 and the gate insulating film 4 were anisotropically etched, and thereby a sidewall spacer 16 was formed on side surfaces of the gate electrode 6.

Then, as shown in FIG. 4 (h), the high concentration impurity layer (a part of the semiconductor region) 17 was selectively formed on the N-type low concentration impurity region 8 and the P-type low concentration impurity region 13 in a region other than the gate insulating film 4. In the present Reference Embodiment, a silicon germanium (SiGe) film having a film thickness of 5 to 200 nm was formed as the high concentration impurity layer 17. In the present Reference Embodiment, a film containing 1 to 40 atom % of Ge and 1E+17 ($1 \times 10^{17}$) to 1E+20 ($1 \times 10^{20}$) ions/cm$^3$ of phosphorus ion (atom) as the impurity was formed as the high concentration impurity layer 17.

Then, as shown in FIG. 4(i), a resist 18 was formed in a region for forming the N-type TFT so that an impurity ion 19 can be injected only into the region for forming the P-type TFT, and then the impurity ion 19 was injected into the high concentration impurity layer 17. As a result, a P-type high concentration impurity region 20 was formed. The impurity ion 19 was not injected into the region for forming the N-type TFT because the region was covered with the resist 18. In the present Reference Embodiment, a boron ion as the impurity ion 18 was injected at an energy level of 5 to 100 keV and a dose amount of $5 \times 10^{16}$ ions/cm$^2$.

Then, the impurity ions injected into the N-type low concentration impurity region 8, the P-type low concentration impurity region 13 and the P-type high concentration impurity region 20 were activated by a furnace annealing method, a lamp annealing method, a laser annealing method, or a self-activity method. Then, as shown in FIG. 4(j), a second interlayer insulating film 21 was formed and then, a contact hole, source or drain wiring 22 was formed. Then, a third insulating film 23 was formed.

This Nonprovisional application claims priority (under 35 U.S.C. §119) on Patent Application No. 2004-361981 filed in Japan on Dec. 14, 2004, the entire contents of which are hereby incorporated by reference.

EXPLANATION OF NUMERALS AND SYMBOLS

Figure 1:
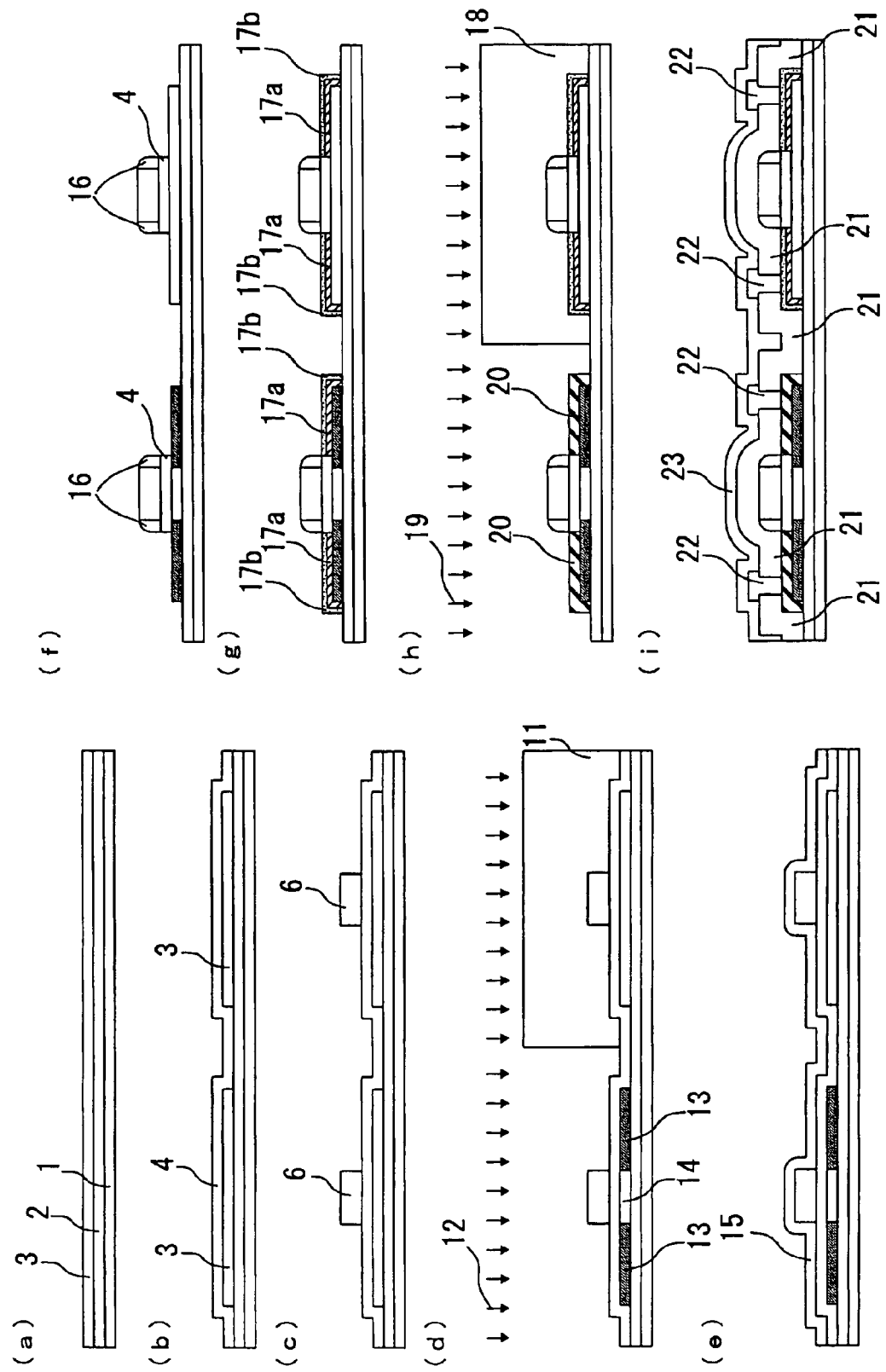
FIG. 1 is a cross-sectional view schematically showing a production method of a semiconductor device according to Embodiment of the present invention.
Figure 2:
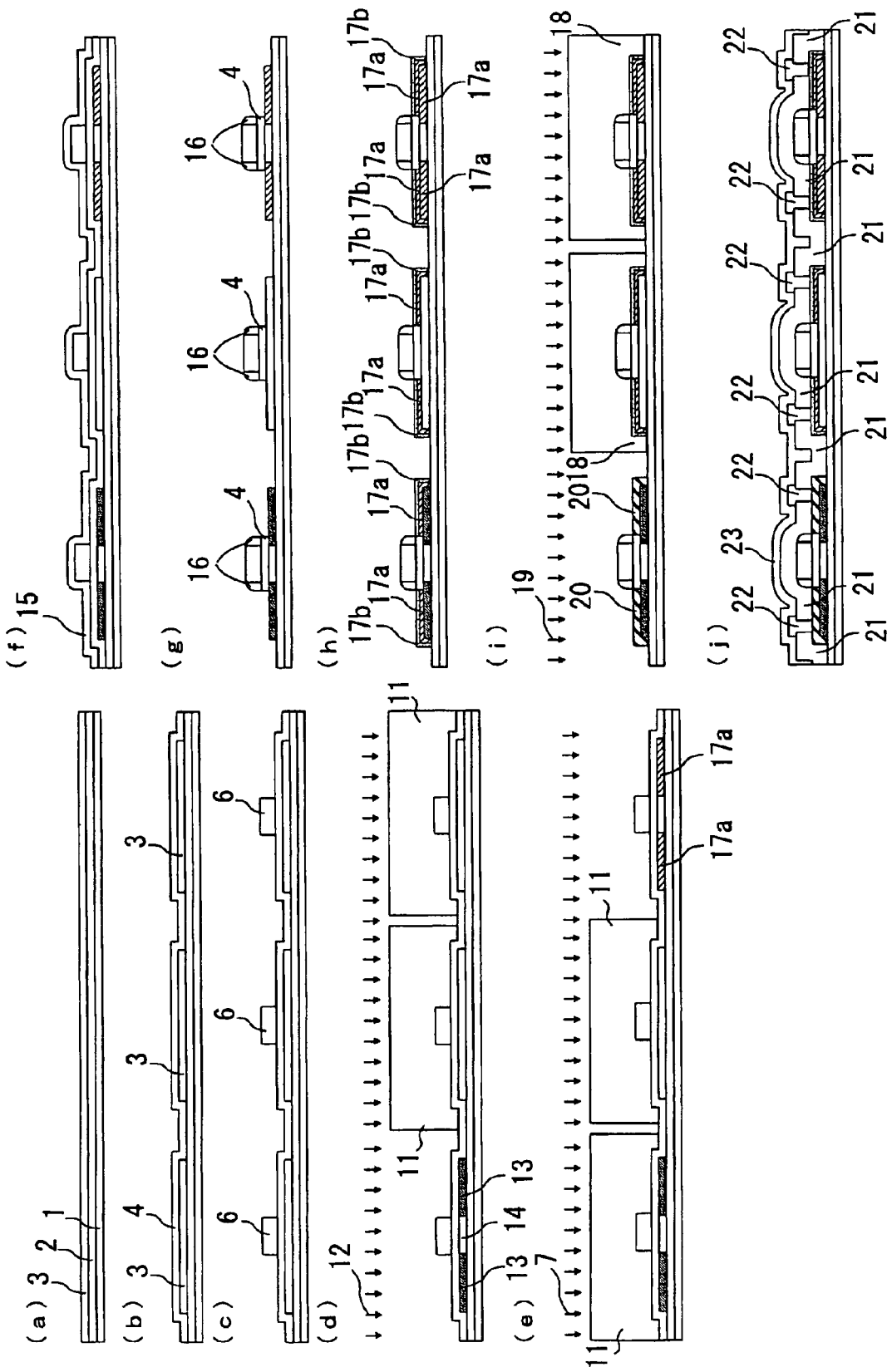
FIG. 2 is a cross-sectional view schematically showing one embodiment of the production method of the semiconductor device of the present invention.
Figure 3:
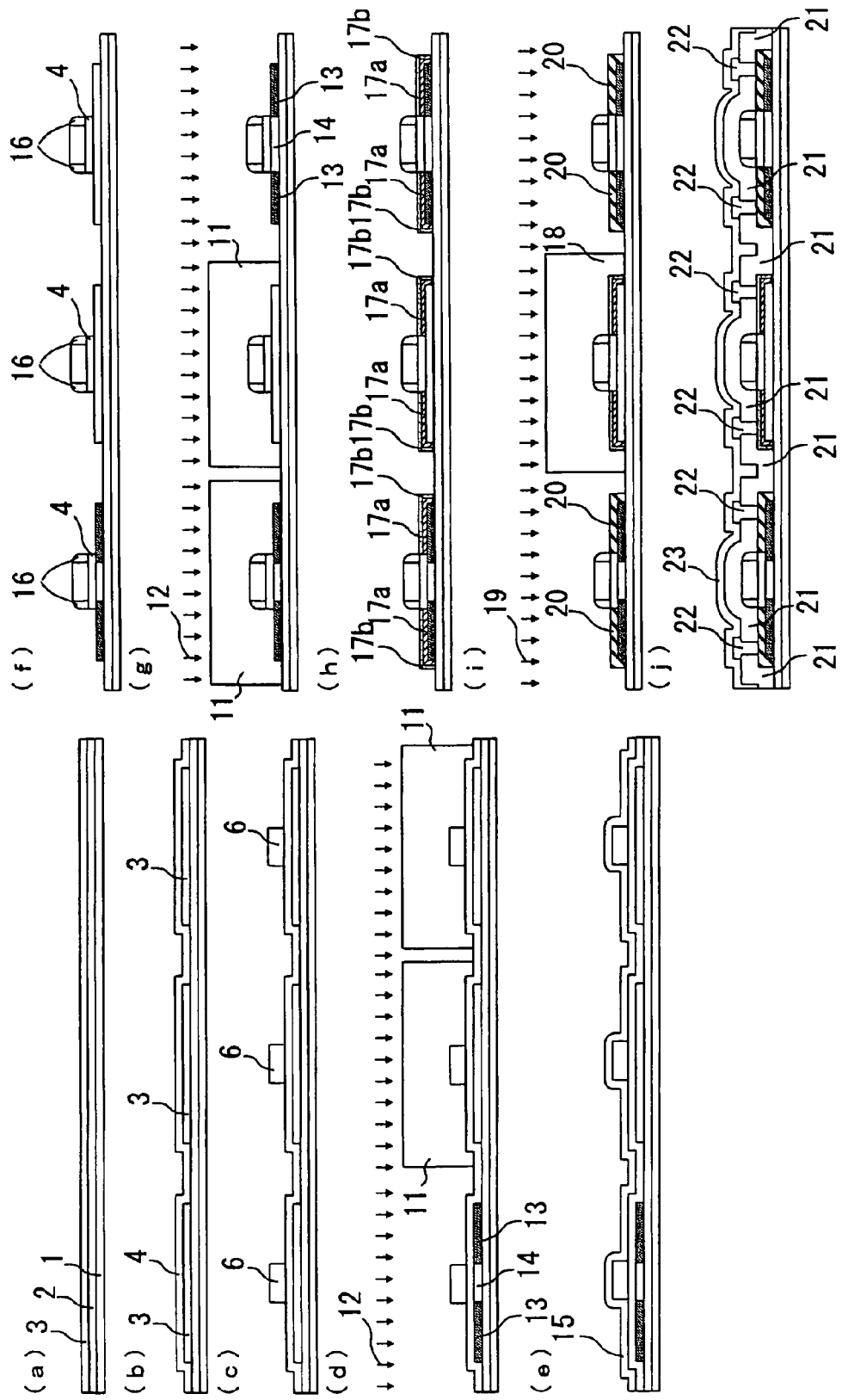
FIG. 3 is a cross-sectional view schematically showing one embodiment of the production method of the semiconductor device of the present invention.
Figure 4:
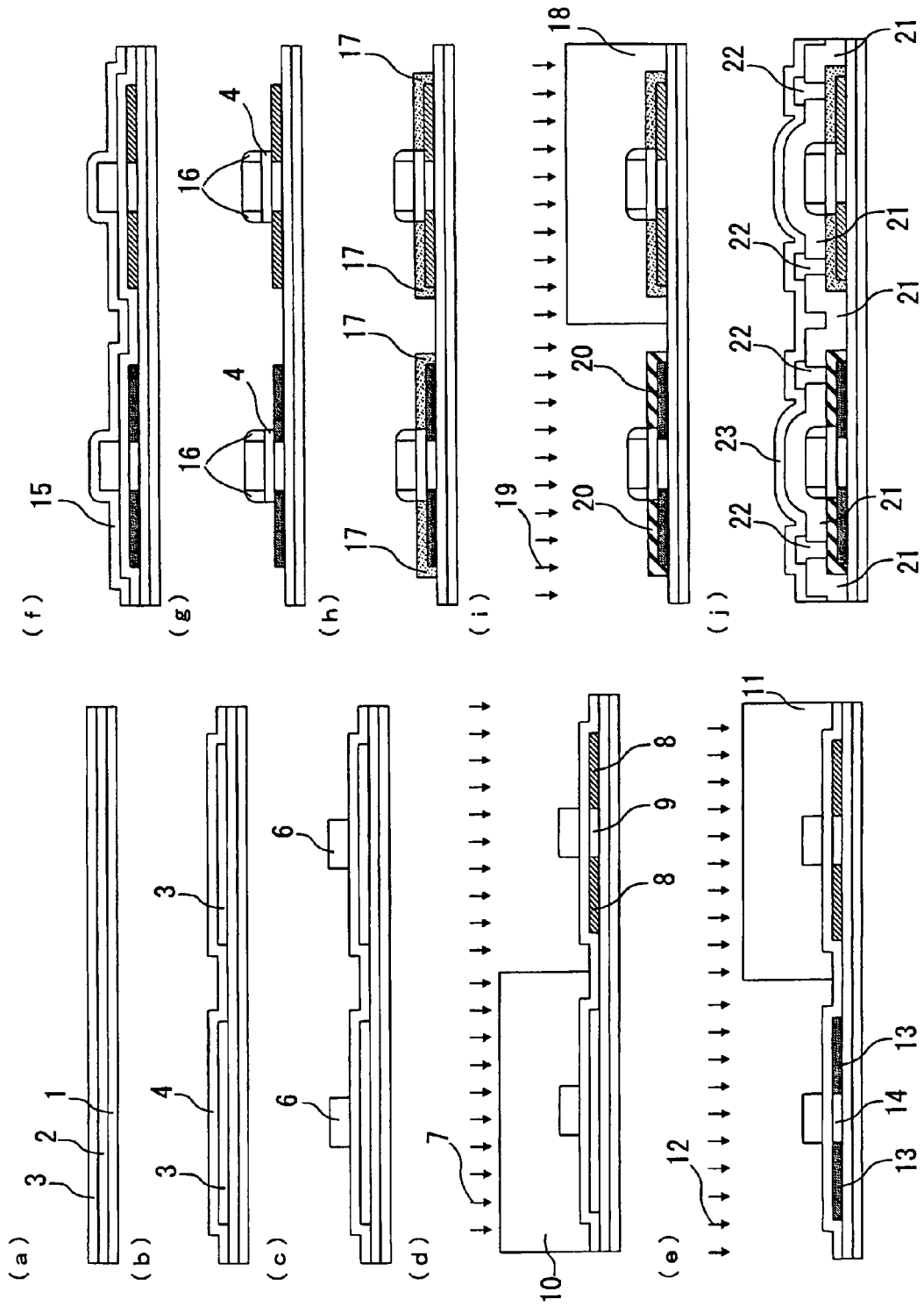
FIG. 4 is a cross-sectional view schematically showing one embodiment of the production method of the semiconductor device in Reference Example.
Figure 5:
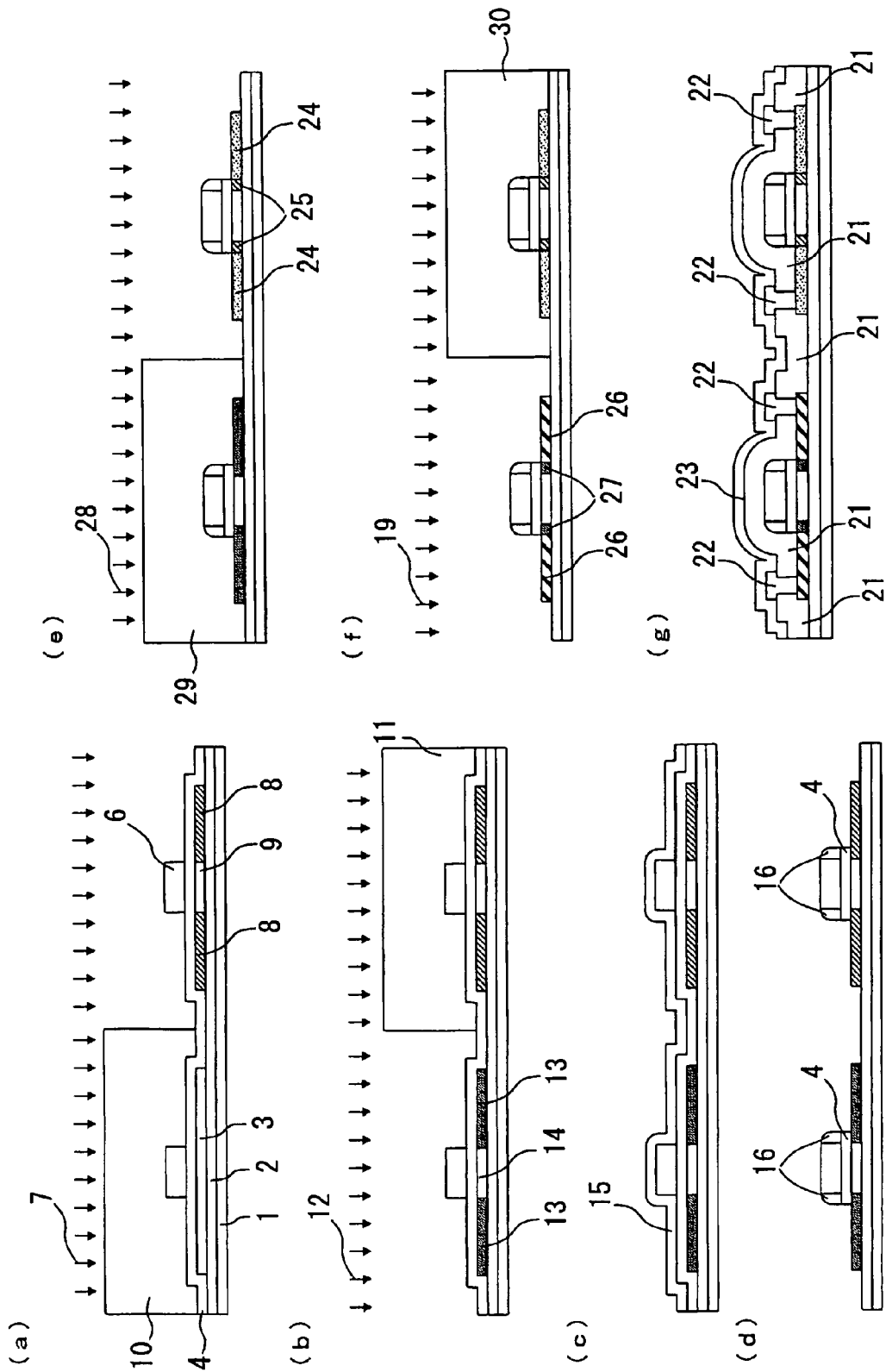
FIG. 5 is a cross-sectional view schematically showing a conventional production method of a semiconductor device.

1: substrate
2: insulating film
3: semiconductor layer
4: gate insulating film
6: gate electrode
7, 12, 19, 28: impurity ion
8, 25: N-type low concentration impurity region (a part of semiconductor region)
9, 14: channel region (channel portion, apart of semiconductor region)
10, 11, 18, 29, 30: resist
13, 27: P-type low concentration impurity region (a part of semiconductor region)
15: first interlayer insulating film
16: side wall spacer
17, 17b, 24: N-type high concentration impurity layer (N-type high concentration impurity region)
17a: N-type low concentration impurity layer (N-type low concentration impurity region)
20, 26: P-type high concentration impurity layer (P-type high concentration impurity region)
21: second interlayer insulating film
22: wiring
23: third insulating film

The invention claimed is:

1. A semiconductor device comprising:
a P-type thin film transistor having an LDD structure, an N-type thin film transistor having an off-set gate structure, and a substrate, the P-type thin film transistor including:
a first semiconductor layer having a P-type low concentration impurity region; a first gate insulating film; and a first gate electrode on the substrate in this order, and further including: a first sidewall spacer formed on a side surface of the first gate electrode; and a P-type high concentration impurity layer having higher impurity concentration of a P-type impurity than that of the P-type low concentration impurity region; and the N-type thin film transistor including: a second semiconductor layer; a second gate insulating film; and a second gate electrode on the substrate in this order, and further including: a second sidewall spacer formed on a side surface of the second gate electrode; an N-type low concentration impurity layer; and an N-type high concentration impurity layer having higher impurity concentration of an N-type impurity than that of the N-type low concentration impurity layer; wherein the N-type low concentration impurity layer and the N-type high concentration impurity layer are stacked on the second semiconductor layer in a region other than a region below the second gate electrode and the second sidewall spacer, the P-type low concentration impurity region is formed in a region other than a region below the first gate electrode, the P-type high concentration impurity layer is formed on the P-type low concentration impurity region of the first semiconductor layer in a region other than a region below the first gate electrode and the first sidewall spacer, the P-type high concentration impurity layer contains the P-type impurity together with the N-type impurity contained in the N-type low concentration impurity layer and the N-type high concentration impurity layer, and a sum of a thickness of the N-type low concentration impurity layer and a thickness of the N-type high concentration impurity layer is substantially equal to a thickness of the P-type high concentration impurity layer.

2. The semiconductor device according to claim 1, wherein the first and the second gate insulating films are below the first and the second gate electrodes and the first and the second sidewall spacers.

3. A thin film transistor array substrate comprising the semiconductor device claim 1.

4. A liquid crystal display device comprising the thin film transistor array substrate of claim 3.

5. A semiconductor device comprising:
a P-type thin film transistor having an off-set gate structure, and an N-type thin film transistor having an LDD structure, and a substrate, the N-type thin film transistor including: a first semiconductor layer having an N-type low concentration impurity region; a first gate insulating film; and a first gate electrode on the substrate in this order, and further including: a first sidewall spacer formed on a side surface of the first gate electrode; and an N-type high concentration impurity layer having higher impurity concentration of an N-type impurity than that of the N-type low concentration impurity region; and the P-type thin film transistor including: a second semiconductor layer; a second gate insulating film; and a second gate electrode on the substrate in this order, and further including: a second sidewall spacer formed on a side surface of the second gate electrode; a P-type low concentration impurity layer; and a P-type high concentration impurity layer having higher impurity concentration of a P- type impurity than that of the P-type low concentration impurity layer; wherein the P-type low concentration impurity layer and the P-type high concentration impurity layer are stacked on the second semiconductor layer in a region other than a region below the second gate electrode and the second sidewall spacer, the N-type low concentration impurity region is formed in a region other than a region below the first gate electrode, the N-type high concentration impurity layer is formed on the N-type low concentration impurity region of the first semiconductor layer in a region other than a region below the first gate electrode and the first sidewall spacer, the N-type high concentration impurity layer contains the N-type impurity together with the P-type impurity contained in the P-type low concentration impurity layer and the P-type high concentration impurity layer, and a sum of a thickness of the P-type low concentration impurity layer and a thickness of the P-type high concentration impurity layer is substantially equal to a thickness of the N-type high concentration impurity layer.

6. The semiconductor device according to claim 5, wherein the first and the second gate insulating films are below the first and the second gate electrodes and the first and the second sidewall spacers.

7. A thin film transistor array substrate comprising the semiconductor device of claim 5.

8. A liquid crystal display device comprising the thin film transistor array substrate of claim 7.

* * * * *